US006218971B1

(12) United States Patent
Sugihara

(10) Patent No.: US 6,218,971 B1

(45) Date of Patent: Apr. 17, 2001

(54) MULTICHANNEL DIGITAL MIXER DESIGNED FOR CASCADE CONNECTION, AND A CASCADE CONNECTION OF TWO SUCH MIXERS

(75) Inventor: Masahiro Sugihara, Tokorozawa (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 09/571,344

(22) Filed: May 16, 2000

(30) Foreign Application Priority Data

May 17, 1999 (JP) ........................................ 11-135384

(51) Int. Cl.[7] ........................................ H03M 1/00

(52) U.S. Cl. ........................ 341/110; 381/18; 704/267

(58) Field of Search ........................ 341/120, 110, 341/116, 117, 126, 180, 185, 118, 155, 144, 143; 381/18; 204/267; 348/485

(56) References Cited

U.S. PATENT DOCUMENTS 5,794,201 * 8/1998 Nejime et al. .................... 704/267
6,016,114 * 1/2000 Liu et al. .......................... 341/143
6,037,993 * 3/2000 Easley ................................ 348/485

* cited by examiner

*Primary Examiner*—Brian Young
*Assistant Examiner*—John Nguyen
(74) *Attorney, Agent, or Firm*—Woodcock Washburn Kurtz Mackiewicz & Norris LLP

(57) ABSTRACT

A multichannel digital mixer unit for use either independently or, in combination with another mixer unit of identical make, as a cascade mixer system of twice the input channels. The mixer unit comprises ADCs connected one to each analog input, a digital signal processor for mixing the digital outputs from the ADCs, and DACs for translating the digital outputs from the processor into analog signals for production from the mixer unit. For cascade connection, the mixer unit has a set of digital outputs connected directly to the digital signal processor for delivery of some selected output signals therefrom to the other mixer unit, and a set of digital inputs for inputting some selected output signals of the digital signal processor from the other mixer unit. Typically, four "group" signals are sent from the first to the second mixer unit, therein to be mixed with like signals, and two "stereo" signals and two "effect" signals are sent from the second to the first mixer unit, also therein to be mixed with like signals. The control circuitries of both mixer units are interfaced to enable control of both units by one unit.

7 Claims, 5 Drawing Sheets

MULTICHANNEL DIGITAL MIXER DESIGNED FOR CASCADE CONNECTION, AND A CASCADE CONNECTION OF TWO SUCH MIXERS

BACKGROUND OF THE INVENTION

This invention relates generally to mixers, more particularly to a multichannel digital mixer suitable for handling audio signals, and still more particularly to such a mixer designed explicitly for cascade connection with another mixer of identical make, beside being capable of use as an independent unit. The invention also pertains to a system of two such multichannel digital mixers in cascade connection.

Sixteen-input mixers are in widespread use for mixing audio signals from as many individual microphones. Audio engineers are, however, not always satisfied with sixteen channels but sometimes desire more channels. Conventionally, for fulfillment of this desire, it has been practiced to connect two sixteen-input mixer units of identical make in cascade mode by means of cables in cases where a more-than-sixteen-input mixer is not available. The cascaded mixer system provides a total of thirty-two inputs.

The cascading of two analog mixer units is easy if each one is fabricated with that mode of use in mind, complete with a set of cascading inputs in addition to the regular signal inputs. One mixer unit has its cascading inputs left unused but has its combined signal outputs cabled to the cascading inputs of the other mixer unit.

The audio outputs from microphones or the like are directed into the respective input circuits of the two mixer units thereby to be variously conventionally processed and routed to provide, for instance, left and right "stereo" signals, four-channel "group" signals for monitoring, and two-channel "effect" signals for echo and other acoustic effects. The output signals from the first mixer unit are directed into the cascading inputs of the second unit thereby to be combined with like signals. The combined signals are produced from the outputs of the second mixer unit.

Recently, with the advent and increasing commercial acceptance of compact disks and other digital audio signal sources, analog mixers are being superseded by digital mixers. Being functionally equivalent to analog mixers, digital mixers also lend themselves to cascade connection, provided, however, that each unit is furnished with digital output circuits and digital input circuits for cascading.

An objection to the prior art digital mixer units designed for cascade connection is that the provision of many such digital output circuits and input circuits have rendered each unit very costly. The mixer system constituted of two such prior art digital mixer units in cascade connection is itself objectionable, too, because of the necessity for operating the control boards of both units.

SUMMARY OF THE INVENTION

The present invention aims at the provision of a digital mixer unit explicitly designed for use either singly or in cascade connection with another unit of like construction.

Another object of the invention is to attain the first recited object by making the construction of each mixer unit, as well as interconnections between two such units, as simple as feasible without impairment of their intended functions either as independent mixers or as a cascade mixer system.

Still another object of the invention is to make the cascade connection of two mixer units operable on one unit only.

Briefly summarized in one aspect thereof, the present invention provides a multichannel digital mixer unit for use either singly or in cascade connection with another mixer unit of identical make. The mixer unit comprises: (a) a plurality of analog inputs for inputting as many analog signals to be mixed; (b) at least one digital input for inputting a digital output signal from a second mixer unit of identical make if such a unit is connected in cascade with the instant unit; (c) a plurality of analog-to-digital converters connected one to each analog input for digitizing the input analog signals; (d) a digital signal processor connected to the digital input and the analog-to-digital converters for producing a plurality of digital output signals by mixing the digital input signal, if any, from the second mixer unit and the outputs from the analog-to-digital converters; (e) a plurality of digital-to-analog converters connected to the digital signal processor for converting the digital output signals therefrom into analog signals; (f) a plurality of analog outputs connected one to each digital-to-analog converter for putting out the analog output signals therefrom; (g) at least one digital output connected to the digital signal processor for putting out at least one of the digital output signals therefrom for application to the digital input of the second mixer unit if such a unit is cascaded with the instant unit; (h) operating means for manually inputting instructions indicative of instructions to be performed by the digital signal processor on the signals input thereto; (i) control means connected between the operating means and the digital signal processor for causing the latter to process the input signals according to the instructions from the operating means; and (j) control input/output means for connecting the control means to like control means of the second mixer unit if such a unit is cascaded with the instant unit, in order to permit control of both mixer units by either mixer unit.

Another aspect of the invention concerns a digital cascade mixer system comprising two digital mixer units, each constructed as in the foregoing, in cascade connection with each other. The two mixer units are cascaded by connecting the digital output or outputs of a first unit to the digital input or inputs of a second unit, the digital output or outputs of the second unit to the digital input or inputs of the first unit, and by interconnecting the control input/output means of both unit&

In the preferred embodiment to be disclosed subsequently, two sixteen-channel mixer units, each constructed as in the summary above, are cascaded to provide a thirty-two-channel mixer system for processing as many analog audio outputs from individual microphones. Only four selected outputs (e.g. "group" signals) from the digital signal processor of one mixer unit are directed to the digital inputs of the second unit, therein to be mixed with like signals. Another four selected outputs (e.g. two "stereo" signals and two "effect" signals) from the digital signal processor of the second unit are directed to the digital inputs of the first unit, also therein to be mixed with like signals.

The mixing of thirty-two input audio signals is possible in the above described manner even though the two cascaded mixer units are each greatly simplified in construction compared to the noted prior art mixers designed for cascading.

For even simpler connection of the two mixer units according to the invention, it is recommended that the desired digital audio signals be transferred between the two mixer units by multiplex transmission. Each mixer unit incorporates two digital output circuits in the preferred embodiment, each for multiplexing two outgoing digital audio signals, and two digital input circuits for demultiplexing the two incoming digital audio signals into four. Only half as many audio signal paths are then required between the two mixer units as when they are sent separately.

The present invention also proposes the interconnection of the control sections of both mixer units, preferably by means meeting the standard MIDI interface criteria. The cascade mixer system will then become operable on one mixer unit by establishing master-slave relationship between the two units.

The above and other objects, features and advantages of this invention and the manner of achieving them will become more apparent, and the invention itself will best be understood, from a study of the following description and attached claims, with reference had to the accompanying drawings showing the preferred embodiment of the invention.

DESCRIPTION OF THE PREFERRED EMBODIMENT

Figure 1:
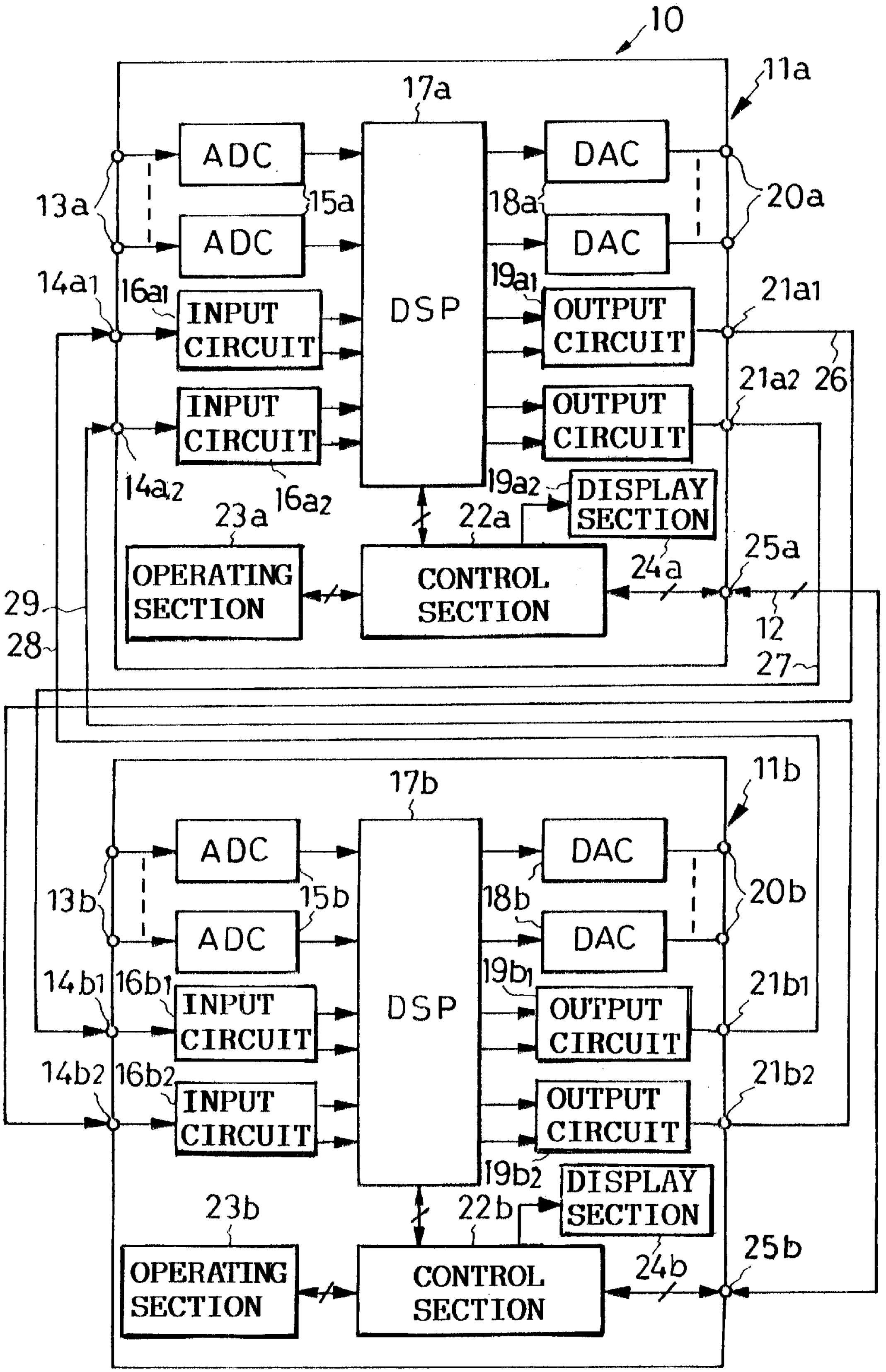
FIG. 1 is a block diagram of two sixteen-channel digital mixer units, each constructed according to the present invention, cascaded into a unitary thirty-two-channel mixer system also in accordance with the invention.

The present invention is believed to be best embodied in the digital mixer system diagramed in FIG. 1. Generally designated 10, the representative mixer system is essentially a tandem connection of a first digital mixer unit 11*a* and a second digital mixer unit 11*b*. The two mixer units 11*a* and 11*b* are of identical make, each constructed in accordance with the invention, and may be put to use either singly or, as pictured here, in cascade connection with each other to make up a streamlined mixer system.

Each of the two mixer units 11*a* and 11*b* comprises sixteen-channel analog signal inputs 13*a* or 13*b*, two digital signal inputs 14$a_1$ and 14$a_2$, or 14$b_1$ and 14$b_2$, sixteen analog-to-digital converters (ADCs) 15*a* or 15*b*, two digital signal input circuits 16$a_1$ and 16$a_2$, or 16$b_1$ and 16$b_2$, a digital signal processor (DSP) or digital mixer 17*a* or 17*b*, eight digital-to-analog converters (DACs) 18*a* or 18*b*, two digital signal output circuits 19$a_1$ and 19$a_2$, or 19$b_1$ and 19$b_2$, analog signal outputs 20*a* or 20*b*, two digital signal outputs 21$a_1$ and 21$a_2$, or 21$b_1$ and 21$b_2$, a control section 22*a* or 22*b*, an operating section 23*a* or 23*b* , a display section 24*a* or 24*b*, and a MIDI control signal input/output terminal 25*a* or 25*b*.

The sixteen-channel analog signal inputs 13*a* or 13*b* of each mixer unit 11*a* or 11*b*, to which there may be supplied analog outputs from individual microphones, not shown, are all connected to the DSP 17*a* or 17*b* via the respective ADCs 15*a* or 15*b*. The two digital signal inputs 14$a_1$ and 14$a_2$, or 14$b_1$ and 14$b_2$, of each mixer unit are also connected to the DSP 17*a* or 17*b* via the respective input circuits 16$a_1$ and 16$a_2$, or 16$b_1$ and 16$b_2$. Each DSP 17*a* or 17*b* has eight outputs connected respectively to the analog signal outputs 20*a* or 20*b* via the DACS 18*a* or 18*b*. Each DSP 17*a* or 17*b* has additional outputs connected respectively to the digital signal outputs 21$a_1$ and 21$a_2$, or 21$b_1$ and 21$b_2$, via the digital signal output circuits 19$a_1$ or 19$a_2$, or 19$b_1$ and 19$b_2$. Out of the eight analog signal outputs 20*a* or 20*b* of each mixer unit 11*a* or 11*b*, two are "stereo" signal outputs, other four are "group" signal outputs, and the remaining two are "effect" signal outputs.

The control section 22*a* or 22*b* of each mixer unit 11*a* or 11*b* is connected to all of the DSP 17*a* or 17*b*, the operating section 23*a* or 23*b*, the display section 24*a* or 24*b*, and the MIDI input/output terminal 25*a* or 25*b*. It is among the functions of the control section 22*a* or 22*b* to control the associated DSP 17*a* or 17*b* as instructed from the operating section 23*a* or 23*b*, to control the associated display section 24*a* or 24*b* in relation to operations taking place elsewhere in the system, and to control signal transmission and reception between the two mixer units 11*a* and 11*b*.

The MIDI input/output terminals 25*a* and 25*b* of both mixer units 11*a* and 11*b* are interconnected by a MIDI interface cable 12. Data transfer in packet form is therefore possible between these input/output terminals 25*a* and 25*b* as control input/output means.

Figure 2:
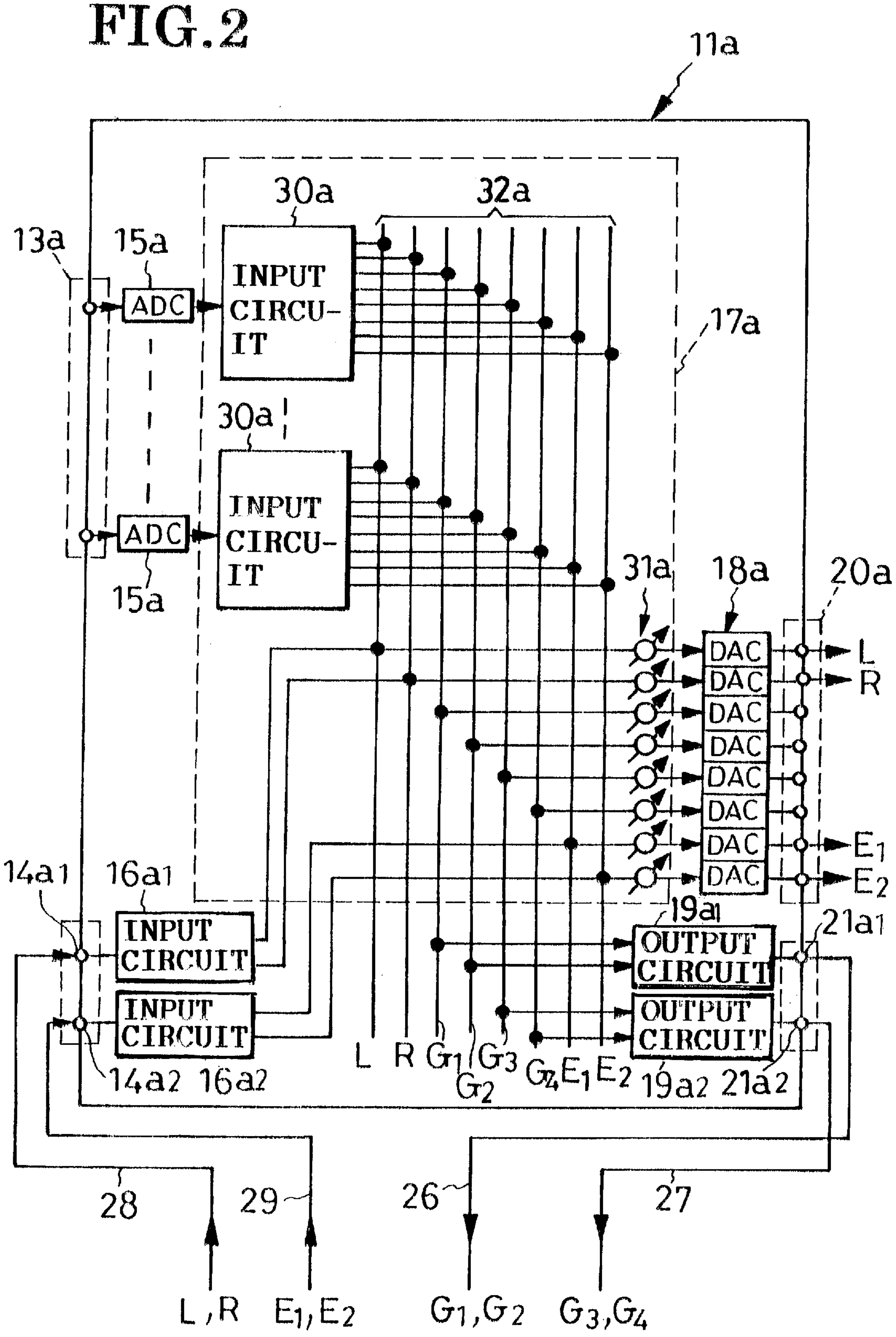
FIG. 2 is a more detailed schematic electrical diagram showing in particular those parts of the first mixer unit of the FIG. 1 mixer system which are related to the audio signals being processed therein.
Figure 3:
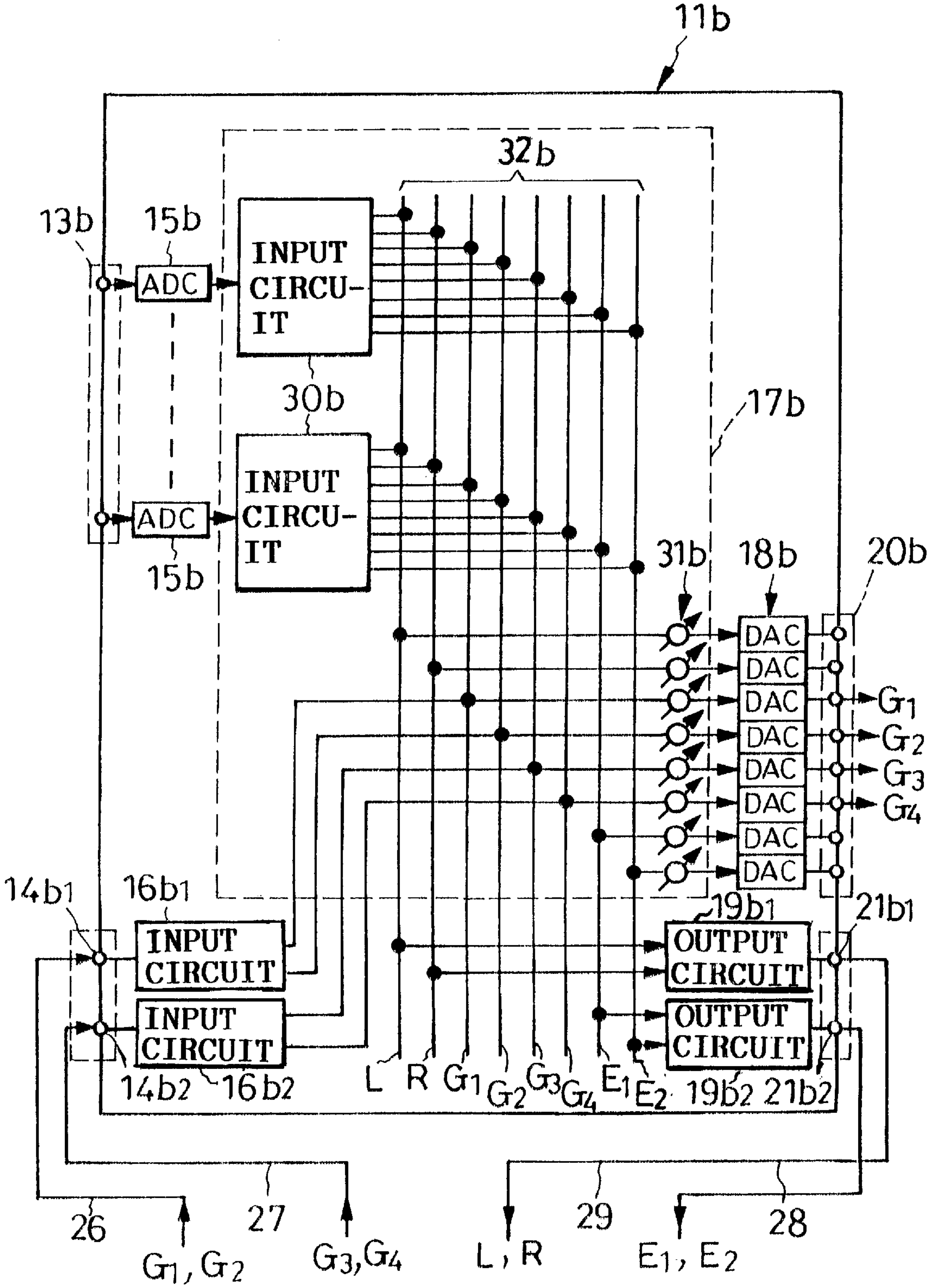
FIG. 3 is a diagram similar to FIG. 2 but showing in particular those parts of the second mixer unit of the FIG. 1 mixer system which are related to the audio signals being processed therein.

FIGS. 2 and 3 are explanatory of how the input audio signals travel through the first mixer unit 11*a* and the second mixer unit 11*b*, respectively. When these mixer units are used each by itself, the sixteen-channel analog audio signals received at the inputs 13*a* or 13*b* will be digitized by the respective ADCs 15*a* or 15*b*. The digital audio signals will then be mixed at the DSP 17*a* or 17*b*. Then, after being reconverted into analog signals by the DACs 18*a* or 18*b*, the mixed signals will be produced from the outputs 20*a* or 20*b*. In this case, as each mixer unit is assumed to be used individually, the "stereo" signals L and R, "group" signals $G_1$–$G_4$, and "effect" signals $E_1$ and $E_2$ will all emerge from the outputs 20*a* or 20*b*.

The DSP 17*a* or 17*b* of each mixer unit 11*a* or 11*b* is shown equivalently to comprise input circuits 30*a* or 30*b* for processing the digitized audio signals, digital data buses 32*a* or 32*b*, and level adjusters 31*a* or 31*b*. Typically comprising gain controls, three-band equalizers, panpots, and channel faders, the input circuits 30*a* and 30*b* puts out the processed digital audio signals on the buses 32*a* or 32*b*. These buses function as mixers, combining the outputs from all the input circuits 30*a* or 30*b*. The buses 32*a* and 32*b* are comprised of two "stereo" signals buses, four "group" signals buses, and two "effect" signal buses. The signals L, R, $G_1$–$G_4$ and $E_1$–$E_2$ on the busses 32*a* or 32*b* are individually adjusted by the level adjusters 31*a* or 31*b* and subsequently reconverted into analog signals by the DACs 18*a* or 18*b*.

Cascaded as in FIG. 1, the two mixer units 11*a* and 11*b* are intended to transfer the digital audio signals therebetween. Toward this end, as indicated in FIGS. 2 and 3, each mixer unit comprises two digital output circuits 19$a_1$ and 19$a_2$, or 19$b_1$ and 19$b_2$, and two digital input a circuits 16$a_1$ and 16$a_2$, or 16$b_1$ and 16$b_2$. These output circuits are multiplexers, and the input circuits are demulplexers, as set forth in more detail hereafter.

Thus, in the first mixer unit 11*a* of FIG. 2, the first digital output circuit 19$a_1$ has inputs connected to two "group" signal buses for combining the first and second "group" signals $G_1$ and $G_2$ for multiplex transmission from the first digital output 21$a_1$. The second digital output circuit 19$a_2$ has inputs connected to two other "group" signal buses for combining the third and fourth "group" signals $G_3$ and $G_4$ for multiplex transmission from the second digital output 21$a_2$. The two digital outputs 21$a_1$ and 21$a_2$ are connected to the digital inputs 14$b_1$ and 14$b_2$, FIG. 3, of the second mixer unit 11*b* by way of cables or other transmission paths 26 and 27, respectively.

In the second mixer unit 11*b* of FIG. 3, on the other hand, the first digital output circuit 19$b_1$ has inputs connected to the two "stereo" signal buses for combining the first and second "stereo" signals L and R for multiplex transmission from the first digital output 21$b_1$. The second digital output circuit 19$b_2$ has inputs connected to the two "effect" signal buses for combining the "effect" signals $E_1$ and $E_2$ for multiplex transmission from the second digital output 21*b*. The two digital outputs 21$b_1$ and 21$b_2$ are connected to the digital inputs 14$a_1$ and 14$a_2$, FIG. 2, of the first mixer unit 11*b* by way of cables or other transmission paths 28 and 29, respectively.

Inputting the multiplex "stereo" signal LR from first digital output circuit 19$b_1$ of the second mixer unit 11*b*, the first digital input circuit 16$_{a1}$ of the first mixer unit 11*a* separates the input signal into the two original "stereo" signals L and R. These signals will then be combined with the like signals L and R of the first mixer unit 11*a* on two of the buses 32*a* carrying such signal. Also, inputting the multiplex "effect" signal $E_1E_2$ from the second mixer 11*b*, the second digital input circuit 16$a_2$ of the first mixer unit 11*a* separates the input signal into the two original "effect" signals $E_1$ and $E_2$. These signals will then be combined with the like signals $E_1$ and $E_2$ of the first mixer unit 11*a* on two others of the buses 32*a* carrying such signals.

Consequently, as indicated in FIG. 2, the first mixer unit 11*a* will produce from four of its analog outputs 20*a* the "stereo" signals L and R and "effect" signals $E_1$ and $E_2$ which have been recreated from both the sixteen-channel inputs of the first mixer unit 11*a* and the sixteen-channel inputs of the second mixer unit 11*b*.

On the other hand, inputting the multiplex "group" signal $G_1G_2$ from the first digital output circuit 19$a_1$ of the first mixer unit 11*a*, the first digital input circuit 16$b_1$ of the second mixer unit 11*b* separates the input signal into the two original "group" signals $G1_1$ and $G_2$. These signals will then be combined with the like signals $G_1$ and $G_2$ of the second mixer unit 11*b* on two of the buses 32*b* carrying such signals. Also, inputting the other multiplex group signal $G_3G_4$ from the second digital output circuit 19$a_2$ of the first mixer unit 11*a*, the second digital input circuit 16$b_2$ of the second mixer unit 11*b* separates the input signal into the two original "group" signals $G_3$ and $G_4$. These signals will then be combined with the like signals $G_3$ and $G_4$ of the second mixer unit 11*b* on two others of the buses 32*a* carrying such signals.

Thus, as indicated in FIG. 3, the second mixer unit 11*b* will produce from four of its analog outputs 20*b* the "group" signals $G_1$–$G_4$ which have been recreated from both the sixteen-channel inputs of the first mixer unit 11*a* and the sixteen-channel inputs of the second mixer unit 11*b*.

It is understood that the two cascaded mixer units 11*a* and 11*b* are controlled for synchronous production of outputs. The "stereo" signals L and R and "effect" signals $E_1$ and $E_2$ put out by the first mixer unit 11*a* and the "group signals $G_1$–$G_4$ put out by the second mixer unit 11*b* are in synchronism with one another.

Let us imagine that the two mixer units 11*a* and 11*b* were to be manipulated independently. Then the final level adjustment of the "stereo" signals L and R and "effect" signals $E_1$ and $E_2$ would have to be done by the level adjusters 31*a* of the first mixer unit 11*a*, and that of the "group" signals $G_1$–$G_4$ by the level adjusters 31*b* of the second mixer unit 11*b*. The mixing engineer would have to reach for both mixer units for such level adjustment. The present invention overcomes this inconvenience by designing the control sections 22*a* and 22*b* of both mixer units so that the final level adjustment of the outputs from the second mixer unit 11*b*, too, can be done on the first mixer unit 11*a*.

It is toward that end that the control sections 22*a* and 22*b* of both mixer units are interconnected by the cable 12 meeting the MIDI interface requirements. The level adjusters 31*b* of the second mixer unit 11*b* are therefore operable from the first mixer unit 11*a* via the control sections 22*a* and 22*b* of both mixer units. More will be said presently on this subject.

Figure 4:
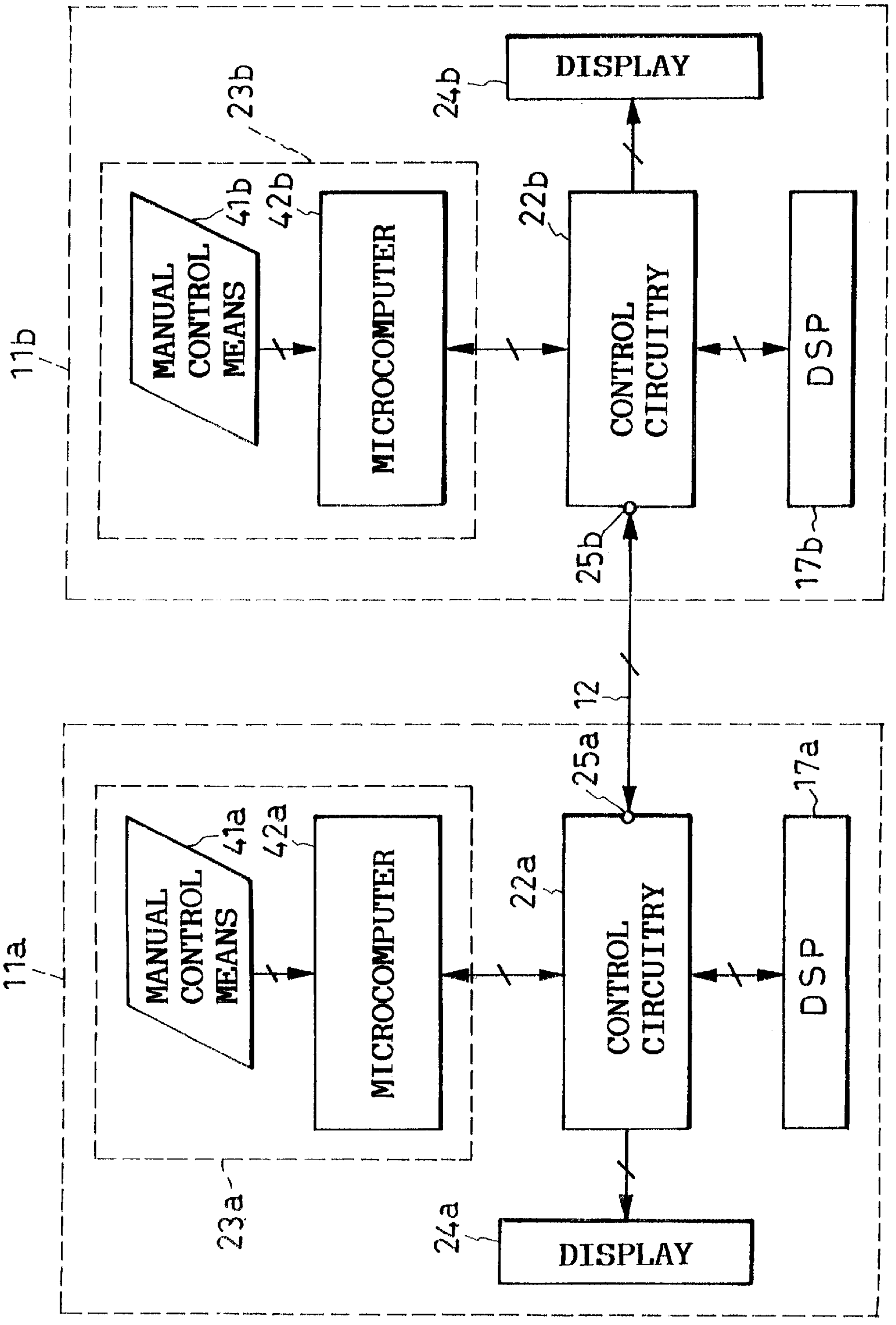
FIG. 4 is a block diagram showing those parts of the FIG. 1 mixer system which are related to the signals for controlling the operations of both mixer units.

Reference may be had to FIG. 4 for a consideration of how the cascaded mixer system of FIG. 1 is controlled. Constituted of a microcomputer or central processor unit, the control section 22*a* or 22*b* of each mixer unit 11*a* or 11*b* controls the DSP 17*a* or 17*b*, the display section 24*a* or 24*b*, and the intercommunication of the two mixer units via the MIDI interfacing, all in response to instructions from the operating section 23*a* or 23*b*. The DSP 17*a* or 17*b* responds to command programs from the control section 22*a* or 22*b* by processing the incoming digital audio signals as schematically illustrated in FIGS. 2 and 3.

The operating section 23*a* or 23*b* of each mixer unit 11*a* or 11*b* comprises manual control means 41*a* or 41*b* for inputting instructions on the equalizers, faders, muting circuits, pans, "solo" switches, etc., and an input microcomputer 42*a* or 42*b*. The manual control means 41*a* or 41*b* when manipulated generate coded electric signals indicative of the desired operations to be performed on the various channels of digital audio signals being input to the mixer unit 11*a* or 11*b*. Receiving these coded signals, the input microcomputer 42*a* or 42*b* delivers corresponding commands to the control section 22*a* or 22*b*.

The display section 24*a* or 24*b* of each mixer unit 11*a* or 11*b* may comprise a liquid-crystal character display and a set of visual level indicators typically in the form of light-emitting diodes. The character display may exhibit, for example, the various working conditions of the system and the instructions being input from the operating section 23*a* or 23*b*. The level indicators indicate the digital audio signal levels as such information is supplied from the DSP 17*a* or 17*b*.

As has been stated, the two mixer units 11*a* and 11*b* may be used either independently or in cascade connection. In order to make such selective use possible, the control sections 22*a* and 22*b* and input microcomputers 42*a* and 42*b* of both mixer units 11*a* and 11*b* are so constructed are understood to be selectively conditioned by the operator for either independent mode or cascade mode. Either mode is selectable by actuation of a mode select switch, not shown, of each operating section 23*a* or 23*b*. The mixer units 11*a* and 11*b* operate individually as sixteen-channel mixers when the independent mode is chosen, and conjointly as a streamlined thirty-two-channel mixer when the cascade mode is chosen.

The digital mixer system 10 can be constructed to permit the following six different kinds of information transfer when operating in the cascade mode:

1. Mixing information transfer for the first mixer unit 11*a*, over the path comprising the operating section 23*a*, control section 22*a*, and DSP 17*a* of the first mixer unit 11*a*.

2. Display information transfer over the path comprising the operating section 23$a$, control section 22$a$, and display section 24$a$ of the first mixer unit 11$a$.

3. Information transfer for discarding unnecessary information, over the path comprising the operating section 23$a$ and control section 22$a$ of the first mixer unit 11$a$.

4. Mixing information transfer for the second mixer unit 11$b$, over the path comprising the operating section 23$a$ and control section 22$a$ of the first mixer unit 11$a$, the cable 12, and the control section 22$b$ and DSP 17$b$ of the second mixer unit 11$b$.

5. Display information transfer for indicating the conditions of the second mixer unit 11$b$ on the display section 24$a$ of the first mixer unit 11$a$, over the path comprising the control section 22$b$ of the second mixer unit 11$b$, the cable 12, and the control section 22$a$ and display section 24$a$ of the first mixer unit 11$a$.

6. Information transfer for controlling the DSP 17$a$ of the first mixer unit 11$a$ by instructions from the second mixer unit 11$b$, over the path comprising the control section 22$b$ of the second mixer unit 11$b$, the cable 12, and the control section 22$a$ and DSP 17$a$ of the first mixer unit 11$a$.

The foregoing six kinds of information transfer, with the associated transfer paths, will be employed, either singly or in combination, as the cascade mixer system 10 is put to use in various ways. The following are some examples:

1. The first and fourth kinds of information transfer:

Adjustment of the output levels of the "group" signals $G_1$–$G_4$ of the second mixer unit 11$b$ from the operating section 23$a$ of the first mixer unit 11$a$.

2. The first and fourth kinds of information transfer:

Audibly checking any desired channels of signals of the first mixer unit 11$a$ by operating the "solo" switches of the first mixer unit, or any desired channels of signals of the second mixer unit 11$b$ by operating the "solo" switches of that unit. Manipulation of any particular solo switch on each mixer unit causes the control section 22$a$ or 22$b$ to mute all but the desired channel.

3. The fourth and sixth kinds of information transfer:

It is recommended from the standpoints of cost reduction and less space requirement of each unit that operating means for some optional mixer function or functions (e.g. auxiliary equalization) be provided not for each channel but in common for all the channels and selectively connected to each channel by a selector switch, not shown. The sixth kind of information transfer is used for this purpose in the case where the control section 22$a$ of the first mixer unit 11$a$ is to control the DSP 17$a$ under command from the unshown selector switch of the second mixer unit 11$b$. The fourth kind of information transfer will also be used in this case as the second mixer unit 11$b$ will have to be notified of the operations taking place in the first mixer unit 11$a$.

4. The fifth kind of information transfer:

The exhibition, on the display section 24$a$ of the first mixer unit 11$a$, of the signal levels of the "group" buses of the second mixer unit 11$b$.

Figure 5:
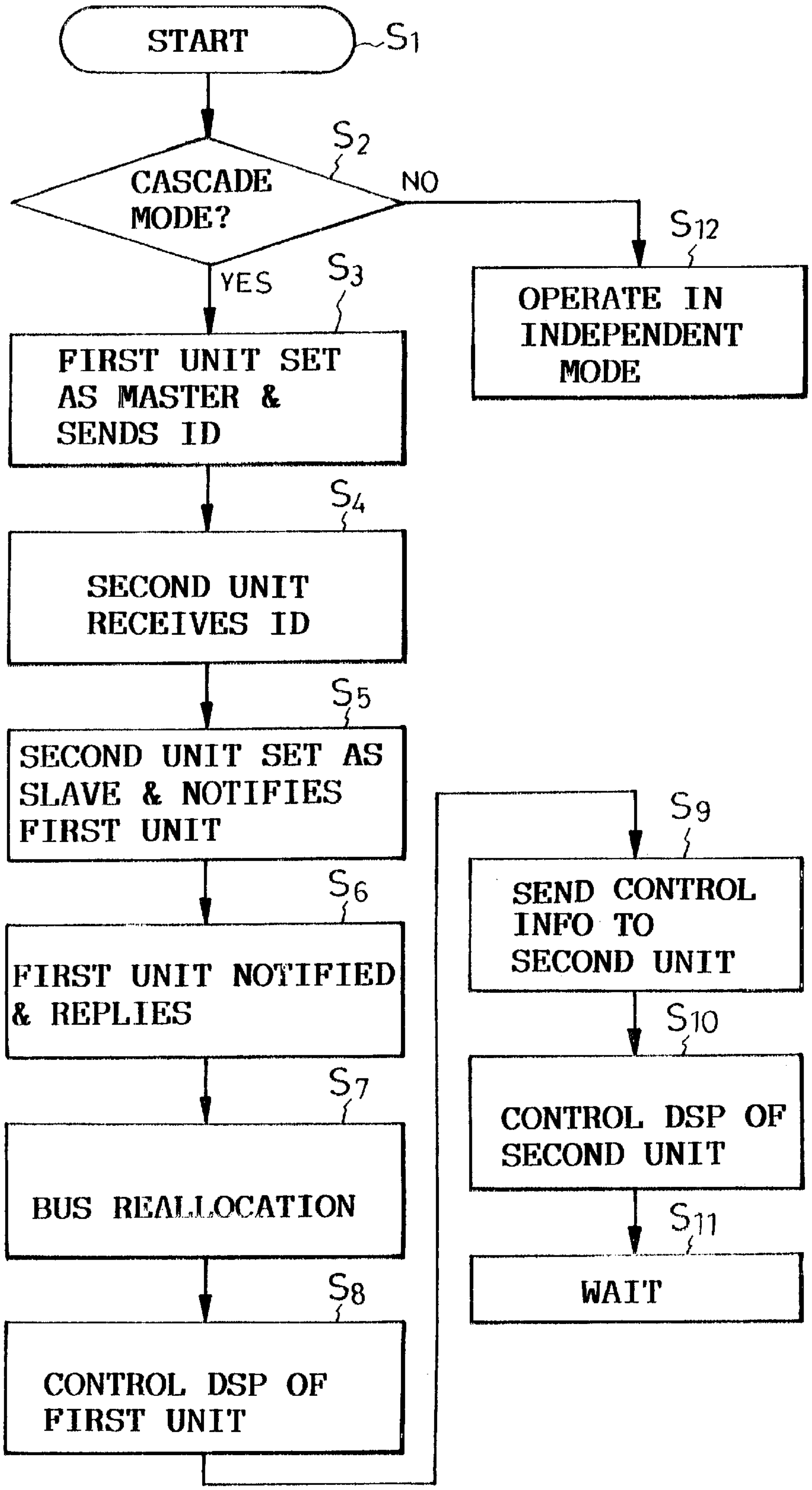
FIG. 5 is a flow chart explanatory of how master-slave relationship is established between the two units of the FIG. 1 mixer system for manual control of both units from one unit.

For adjustment of the output levels of the "group" signals $G_1$–$G_4$ of the second mixer unit 11$b$ from the operating section 23$a$ of the first mixer unit 11$a$, listed first above, the mixer system 10 will operate as flowcharted in FIG. 5 according to the program introduced into the control sections 22$a$ and 22$b$ of both mixer units.

After interconnecting the two mixer units 11$a$ and 11$b$ as shown in FIG. 1, the unshown mode select switch on the operating section 23$b$ may be operated to select the cascade mode. Then those level adjusters 31$a$ of the first mixer unit 11$a$ which are connected to the group buses $G_1$–$G_4$ thereof may be operated on the operating section 23$a$.

Now will start at $S_1$ the subroutine of FIG. 5. Next comes the node $S_1$ which asks whether the cascade mode has been chosen or not. The answer "no" to this question will result in operation of both mixer units in independent mode. If the answer is "yes," on the other hand, then it is dictated by the block $S_3$ that the first mixer unit 11$a$ operate as master and send its self-identification signal to the second mixer unit 11$b$. Receiving this signal at the block $S_4$, the second mixer unit 11$b$ conditions itself for operation as slave at the next block $S_6$ and further sends its self-identification signal back to the first mixer unit 11$a$, together with a query as to whether the identity of the second mixer unit has been ascertained by the first mixer unit. The first mixer unit 11$a$ replies to the second mixer unit 11$b$ that it has duly received the self-identification signal of the second mixer unit and identified it, at the block $S_6$. The cascade connection of the two mixer units 11$a$ and 11$b$ have now been completed, making them ready for operation as master and slave, respectively.

The setting of the first mixer unit 11$a$ in master mode at the block $S_3$, and of the second mixer unit 11$b$ in slave mode at the block $S_5$, are both not an absolute requirement. Such settings might be made instead after the block $S_6$.

The next block $S_7$ calls for buss reallocation. Being the master, the first mixer unit 11$a$ may have the channel numbers one through sixteen of its inputs left unchanged. The channel numbers of the slave unit 11$b$ must have its channel numbers redesignated from one through sixteen to seventeen through thirty-two.

Then, at the block $S_8$, the operator may operate the level adjusters 31$a$ of the master unit 11$a$ from the operating section 23$a$ thereof in order to cause signal transmission to the DSP 17$a$ over the first recited path for adjustment of the "stereo" signals L and R and the "effect" signals $E_1$ and $E_2$. The "stereo" signals L and R and "effect" signals $E_1$ and $E_2$ will then be put out as adjusted by the operator.

Although the "group" signals $G_1$–$G_4$ are being processed in the slave unit 11$b$, the adjustment of their levels are now being performed on the master unit 11$a$. The instructions that have been input from the operating section 23$a$ of the master unit 11$a$ for processing the "group" signals are therefore transferred at the block $S_9$ to the slave unit 11$b$ over the fourth recited path above. The DSP 17$b$ of the slave unit 11$b$ responds at the block S10 to the instructions thus transferred from the master unit 11$a$, by processing the "group" signals $G_1$–$G_4$ accordingly, and waits for the next instruction at the block $S_{11}$.

The advantages gained by the cascade mixer system 10 may be summarized as follows:

1. The two constituent mixer units 11$a$ and 11$b$ of the system can be used either individually, as sixteen-channel mixers, or in combination as a thirty-two-channel mixer.

2. The mixer units 11$a$ and 11$b$ do not have all their eight outputs interconnected; instead, the four "group" signals $G_1$–$G_4$ of the first unit are send over the paths 26 and 27 to the second unit, and the two "stereo" signals L and R and two "effect" signals $E_1$ and $E_2$ of the second unit are sent over the paths 28 and 29 to the first unit. Consequently, for cascade connection, the first unit 11$a$ requires only two digital input circuits 16$a_1$ and 16$a_2$ and two digital output circuits 19$a_1$ and 19$a_2$, and the second unit 11$b$ only two digital input circuits $16b_1$ and $16b_2$ and two digital output circuits $19b_1$ and $19b_2$, in addition to the preexisting parts for use as independent mixers. Moreover, one digital input circuit and one digital output circuit have conventionally existed in digital mixers. By utilizing these preexisting circuits for the purposes of the instant invention, only one digital input circuit and one digital output circuit need to be added to each mixer unit for transfer of eight different signals between the two units. Each digital output circuit functions to multiplex two signals, and each digital input circuit to demultiplex the input multiplex signal into the two original signals, in the illustrated embodiment of the invention.

3. A master-slave relationship can be established between the two cascaded mixer units 11*a* and 11*b*, it being necessary to manipulate only the first mixer unit 11*a* for operating both units in any desired manner.

4. The transfer of control signals between the two mixer units 11*a* and 11*b*, needed for controlling the second mixer unit from the first, is inexpensively accomplished by taking advantage of the familiar MIDI interfaces customarily incorporated in mixers.

Notwithstanding the foregoing detailed disclosure it is not desired that the present invention be limited by the exact showing of the drawings or the description thereof. The following, then, is a brief list of possible modifications or alterations of the illustrated embodiments:

1. Control of both mixer units 11*a* and 11*b* by the first unit 11*a* is possible even when the two units are cascaded in other than the illustrated way, for example, when all the digital outputs from the DSP 17*b* of the second unit 11*b* are directed into the DSP 17*a* of the first unit 11*a*.

2. The microcomputer 42*a* shown included in the operating section 23*a* or 23*b* of each mixer unit 11*a* or 11*b* in FIG. 4 could be omitted if the microcomputer of the control section 22*a* or 22*b* were equipped to perform its functions.

3. The control sections 22*a* and 22*b* of both mixer units 11*a* and 11*b* could be interconnected via dedicated signal paths other than MIDI interfacing.

4. Each mixer unit could have other than the indicated numbers of input channels and output channels and process the input audio signals in other than the indicated ways.

All these and other changes of the illustrated embodiment are intended in this disclosure. It is therefore appropriate that the invention be construed broadly and in a manner consistent with the fair meaning or proper scope of the annexed claims.

What is claimed is:

1. A multichannel digital mixer unit for use either singly or in cascade connection with another mixer unit of identical make, the mixer unit comprising:

(a) a plurality of analog inputs for inputting as many analog signals to be processed;

(b) at least one digital input for inputting at least one digital output signal from a second mixer unit of identical make in the case where the instant mixer unit is connected in cascade with the second mixer unit;

(c) a plurality of analog-to-digital converters connected one to each analog input for digitizing the input analog signals;

(d) a digital signal processor connected to the digital input and the analog-to-digital converters for producing a plurality of digital output signals by mixing the digital input signal, if any, from the second mixer unit and the outputs from the analog-to-digital converters;

(e) a plurality of digital-to-analog converters connected to the digital signal processor for converting the digital output signals. therefrom into analog signals;

(f) a plurality of analog outputs connected one to each digital-to-analog converter for putting out the analog output signals therefrom;

(g) at least one digital output connected to the digital signal processor for putting out at least one of the digital output signals therefrom for application to the digital input of the second mixer unit in the case where the instant mixer unit is connected in cascade with the second mixer unit;

(h) operating means for manually inputting instructions indicative of instructions to be performed by the digital signal processor on the signals input thereto;

(i) control means connected between the operating means and the digital signal processor for causing the latter to process the input signals according to the instructions from the operating means; and (j) control input/output means for connecting the control means to like control means of the second mixer unit in the case where the instant mixer unit is connected in cascade with the second mixer unit, in order to permit control of both mixer units by either mixer unit.

2. The multichannel digital mixer unit of claim 1 further comprising an output circuit connected between the digital signal processor and the digital output for combining at least two of the digital output signals therefrom for multiplex transmission to the digital input of the second mixer unit.

3. The multichannel digital mixer unit of claim 2 further comprising an input circuit connected between the digital input and the digital signal processor for demultiplexing the digital multiplex output signal from the second mixer unit.

4. A digital cascade mixer system comprising two digital mixer units of identical make in cascade connection with each other, both mixer units being capable of use either singly or in combination, each mixer unit comprising:

(a) a plurality of analog inputs for inputting as many analog signals to be processed;

(b) at least one digital input for inputting at least one digital output signal from the other mixer unit;

(c) a plurality of analog-to-digital converters connected one to each analog input for digitizing the input analog signals;

(d) a digital signal processor connected to the digital input and the analog-to-digital converters for producing a plurality of digital output signals by mixing the digital input signal from the other mixer unit and the outputs from the analog-to-digital converters;

(e) a plurality of digital-to-analog converters connected to the digital signal processor for converting the digital output signals therefrom into analog signals;

(f) a plurality of analog outputs connected one to each digital-to-analog converter for putting out the analog output signals therefrom;

(g) at least one digital output connected to the digital signal processor for putting out at least one of the digital output signals therefrom the digital output being connected to the digital Input of the other mixer unit;

(h) operating means for manually inputting instructions indicative of instructions to be performed by the digital signal processor on the signals input thereto;

(i) control means connected between the operating means and the digital signal processor for causing the latter to process the input signals according to the instructions from the operating means; and (j) control input/output means for connecting the control means to like control means of the other mixer unit in order to permit control of both mixer units by either mixer unit.

5. The digital cascade mixer system of claim 4 wherein each mixer unit further comprises an output circuit connected between the digital signal processor and the digital output for combining at least two of the digital output signals therefrom for multiplex transmission to the digital input of the other mixer unit.

6. The digital cascade mixer system of claim 5 wherein each mixer unit further comprises an input circuit connected between the digital input and the digital signal processor for demultiplexing the digital multiplex output signal from the other mixer unit.

7. The digital cascade mixer system of claim 4 wherein the control input/output means of both mixer units are interconnected by a MIDI interface conductor means.

* * * * *

UNITED STATES PATENT AND TRADEMARK OFFICE

CERTIFICATE OF CORRECTION

PATENT NO. : 6,218,971 B1
DATED : April 17, 2001
INVENTOR(S) : Masahiro Sugihara It is certified that error appears in the above-identified patent and that said Letters Patent is hereby corrected as shown below:

Column 5,
Line 15, please delete "21b" and insert therefor -- $21b_2$ --;

Column 10,
Line 5, please delete "." after the word "signals";
Line 60,please delete "Input" and insert therefor -- input --.

Signed and Sealed this

Twenty-sixth Day of February, 2002

*Attest:*

JAMES E. ROGAN

*Attesting Officer* *Director of the United States Patent and Trademark Office*